(12) United States Patent
Takeishi et al.

(10) Patent No.: US 6,516,991 B2
(45) Date of Patent: Feb. 11, 2003

(54) WIRE BONDING APPARATUS

(75) Inventors: Akira Takeishi, Tokyo (JP); Noriyuki Kubota, Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 09/983,200

(22) Filed: Oct. 23, 2001

(65) Prior Publication Data

US 2002/0050507 A1 May 2, 2002

(30) Foreign Application Priority Data

Oct. 30, 2000 (JP) ........................ 2000-330322

(51) Int. Cl.[7] ................. B23K 37/00; B23K 31/02; B23K 15/02
(52) U.S. Cl. ................. 228/4.5; 228/8; 228/102; 228/180.5
(58) Field of Search ................. 228/102, 103, 228/104, 110.1, 180.5, 1.1, 4.5, 8; 219/85.18

(56) References Cited

U.S. PATENT DOCUMENTS

| | | | | |
|---|---|---|---|---|
| 5,443,200 A | * | 8/1995 | Arikado | 228/102 |
| 5,586,713 A | * | 12/1996 | Arita et al. | 228/102 |
| 6,059,168 A | * | 5/2000 | Shin et al. | 228/4.5 |
| 6,070,778 A | * | 6/2000 | Takahashi et al. | 228/102 |
| 6,095,396 A | * | 8/2000 | Takahashi et al. | 228/1.1 |
| 6,119,914 A | * | 9/2000 | Takahashi et al. | 228/1.1 |
| 6,131,795 A | * | 10/2000 | Sato | 228/102 |
| 6,164,518 A | * | 12/2000 | Mochida et al. | 228/102 |
| 6,206,266 B1 | * | 3/2001 | Takahashi et al. | 228/102 |
| 6,305,594 B1 | * | 10/2001 | Mochida et al. | 228/180.5 |

* cited by examiner

Primary Examiner—Tom Dunn
Assistant Examiner—Colleen P. Cooke
(74) Attorney, Agent, or Firm—Sughrue Mion, PLLC

(57) ABSTRACT

To remove the turbulence affecting the positioning control of a bonding head along the Z axis when a stage is moved in the XY direction, and to exercise accurate wire loop control, a feed forward compensator is provided for a control unit. The feed forward compensator calculates a reaction force, which is applied to a bonding head due to the acceleration generated during horizontal movement along the XY axes, based on the distance between the center of a rotary shaft and the center of gravity of the bonding arm, the mass of the bonding arm, and the acceleration generated when the XY stage is moved along the XY axes. The obtained reaction force is transmitted as a feed forward value to a controller, in order to offset the reaction force.

4 Claims, 7 Drawing Sheets

(PRIOR ART)

(PRIOR ART)

Y AXIAL OPERATING DIRECTION

WIRE BONDING APPARATUS

BACKGROUND OF THE INVENTION

1. Field of the Invention

The present invention relates to a wire bonding apparatus that includes a function for countering the reaction force applied to a bonding head when it is moved horizontally.

2. Description of the Related Arts

FIG. 1 is a plan cross-sectional view of a conventional wire bonding apparatus, and FIG. 2 is a side cross-sectional view of the wire bonding apparatus in the direction C in FIG. 1. In FIGS. 1 and 2, an XY stage 1 is moved horizontally (the X and Y axial directions in FIG. 1) by motors 2 and 3. That is, the XY stage 1 is moved in the Y axial direction by the motor 2, while it is moved in the X axial direction by the motor 3. A bonding head unit 4 is fixed to the XY stage 1.

A bonding arm 6 is provided on the bonding head unit 4 to move along the Z axis at its end perpendicular to the face of the XY stage 1, i.e., perpendicular to the direction in which the XY stage 1 is moved, so that the bonding arm 6 can pivot at a rotary shaft 5. The rotary shaft 5 passes through and is fixed to the center of the bonding arm 6, while both sides of the rotary shaft 5 are supported by the side walls of the bonding head unit 4.

A capillary 7 is attached, via a horn 6-1, to the distal end of the bonding arm 6. A magnet 8-1 for a linear motor 8 is provided at the rear of the bonding arm 6, while a magnetic circuit 8-2 for the linear motor 8 is attached to the bonding head unit 4 and encloses the magnet 8-1.

An encoder 10 is located at one end of the rotary shaft 5 that passes through and is fixed to the bonding arm 6. The encoder 10 detects at the rotary shaft 5 the pivoted position of the bonding arm 6, i.e., the position in the Z axial direction of the bonding head 9 that is constituted by the horn 6-1 and the capillary 7.

A cut clamp attachment arm 11 is attached to the bonding arm 6, and extends out above the bonding head 9. A cut clamp 12 is attached at the distal end of the cut clamp attachment arm 11, and a bonding wire (not shown) leading to the capillary 7 is inserted into the cut clamp 12.

FIG. 3 is a block diagram showing the essential portion of an electronic circuit in a control unit attached to the wire bonding apparatus. A control unit 13 comprises a controller 13-1, an operating unit 13-2 and an amplifier 13-3. The current position of the bonding head 9 in the Z axial direction is transmitted from the encoder 10 to the controller 13-1. The operating unit 13-2 calculates the next position in the Z axial direction to which the bonding head 9 is to be moved, and transmits the position to the controller 13-1.

The controller 13-1 generates a control signal (torque instruction value) by using the current position of the bonding head 9 in the Z axial direction, which is received from the encoder 10, and the next movement position, which is received from the operating unit 13-2, and transmits the control signal to the amplifier 13-3. The amplifier 13-3 amplifies the control signal received from the controller 13-1, and transmits the resultant control signal as a drive signal to the linear motor 8. The linear motor 8 is actuated upon the reception of the drive signal from the controller 13-1 via the amplifier 13-3, and provides a thrusting force at the rear of the bonding arm 6. In response to this thrusting force, the bonding arm 6 pivots at the rotary shaft 5, and the bonding head 9 is moved vertically.

FIG. 4 is a diagram showing the processing during which the wire bonding apparatus actually performs wire bonding.

In FIG. 4, the bonding head 9 rapidly drops at time t1, and when the bonding head 9 has reached the search level, the dropping speed is reduced to a low level (t2 to t3), and US bonding is performed (t3 to t4). Then, the bonding head 9 is raised and the reverse operation is performed (t4 to t5), and a loop-up operation is started (t5 to t6). When the bonding head 9 is continuously raised and reaches a predetermined height (t6 to t7), the loop-down operation is performed (t7 to t8), the bonding head 9 is moved to the lead frame side as the XY stage 1 is moved horizontally, the search operation is again initiated (t8 to t9), and the US bonding is performed (t9 to t10). Following this, the bonding head 9 is raised (t10 to t11), and cut clamp 12 is closed while the bonding wire 15 such as a thin gold wire is cut off (t11 to t12). Then, the distal end of the wire is heated by a voltage discharge and forms a ball (t12 to t13). Thereafter, the cut clamp 12 is opened, and the operation at t1 to t13 is repeated.

However, in the conventional wire bonding apparatus, accurate loop control of the wire along the locus that is prepared in advance can not be exercised, although vertically positions (along the Z axis) of the bonding head 9 before it is moved to the lead frame side (in the XY axial direction) is setting.

This problem occurs because the center of gravity W1 of the bonding arm 6 does not correspond to the center S1 of the rotary shaft 5, which is the pivoting center of the bonding arm 6, and because the moment M1 occurs due to the shifting of the center of gravity when the bonding arm 6 is rapidly moved in the XY axial direction. That is, when the center of gravity W1 of the bonding arm 6 is shifted in position relative to the center Si of the rotary shaft 5, the moment M1 occurs around the rotary shaft 5 due to the acceleration of the axial directional element Y when the XY stage 1 is moved. Because of the occurrence of this moment M1, an unpredicted large reaction force F1 is applied to the bonding head 9, and this reaction force F1 interferes with the positioning of the bonding head 9 along the Z axis.

SUMMARY OF THE INVENTION

To resolve this shortcoming, it is one object of the present invention to provide a wire bonding apparatus that reduces interference with the positioning control of the bonding head in the perpendicular direction (along the Z axis) when it is moved horizontally (along the X and Y axes), and that provides accurate loop control for a wire.

To achieve the above object, according to the present invention, a reaction force applied to a bonding head when it is moved horizontally is calculated; the obtained reaction force is used to correct a torque instruction value that is transmitted to means for driving a bonding arm; and a thrusting force is generated to counter the reaction force applied to the bonding head.

With this arrangement, when the bonding arm is moved horizontally (along the X and Y axes), the reaction force, which is applied to the bonding head due to the acceleration generated at this time, is countered, and interference with the positioning control of the bonding head in the perpendicular direction (along the Z axis) is reduced.

According to the present invention, the reaction force applied to the bonding head is calculated based on the distance between the center of the rotary shaft and the center of gravity of the bonding arm, the mass of the bonding arm, and the acceleration generated when the stage is moved horizontally.

Furthermore, a motor (e.g., a linear motor) is used as means for driving the bonding arm. The reaction force applied to the bonding head is calculated based on the value of a current that flows across the motor, or based on the torque instruction value, which is transmitted to the means for driving the bonding arm, and the current position of the bonding head (the position along the Z axis). In this invention, the reaction force calculation method is not limited to the above method, and the motor that can be used is not limited to a linear motor.

DETAILED DESCRIPTION OF THE PREFERRED EMBODIMENTS

The preferred embodiments of the present invention will now be described in detail while referring to the accompanying drawings.

First Embodiment

Figure 1:
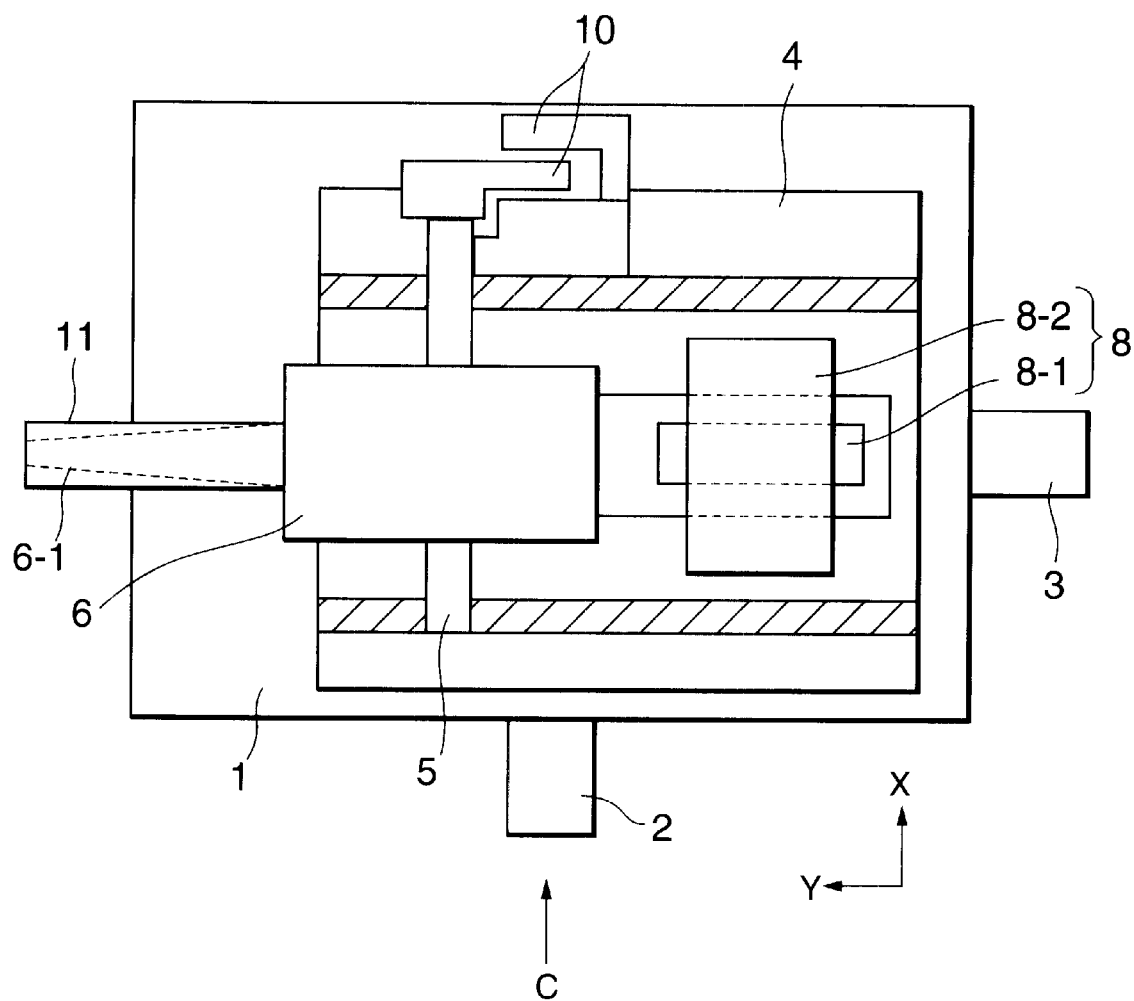
FIG. 1 is a plan cross-sectional view of a conventional wire bonding apparatus.
Figure 2:
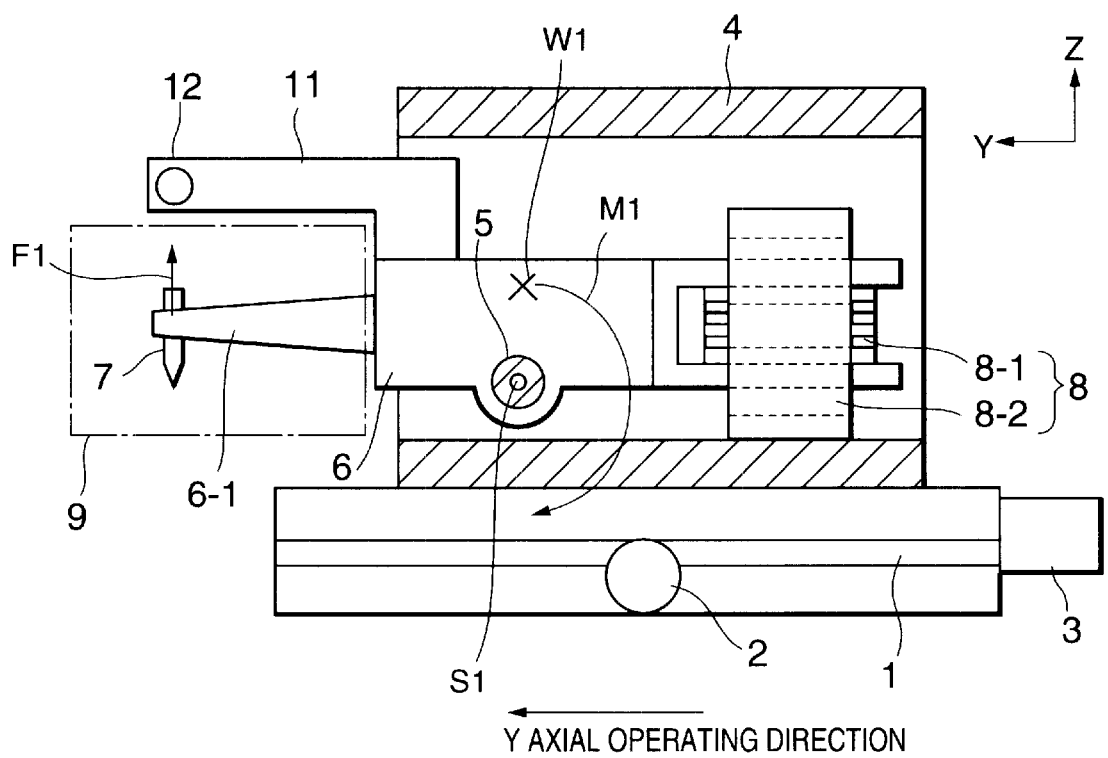
FIG. 2 is a side cross-sectional view of the wire bonding apparatus in the direction C in FIG. 1.
Figure 3:
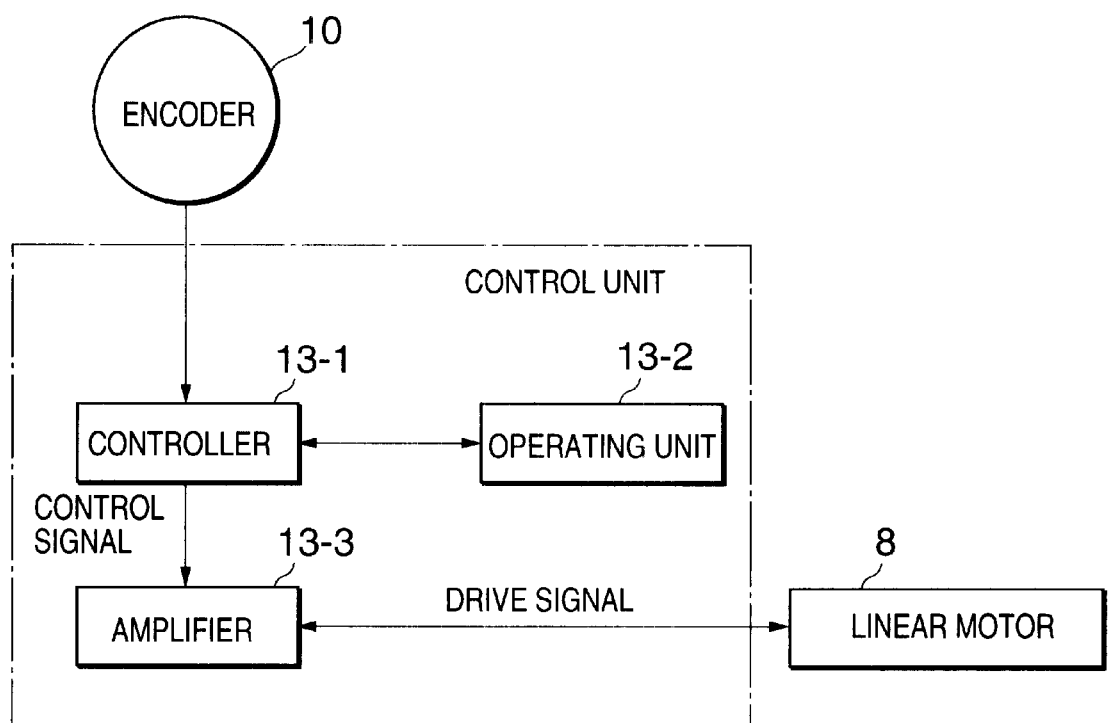
FIG. 3 is a block diagram showing the essential portion of an electronic circuit in a control unit that is attached to the conventional wire bonding apparatus.
Figure 4:
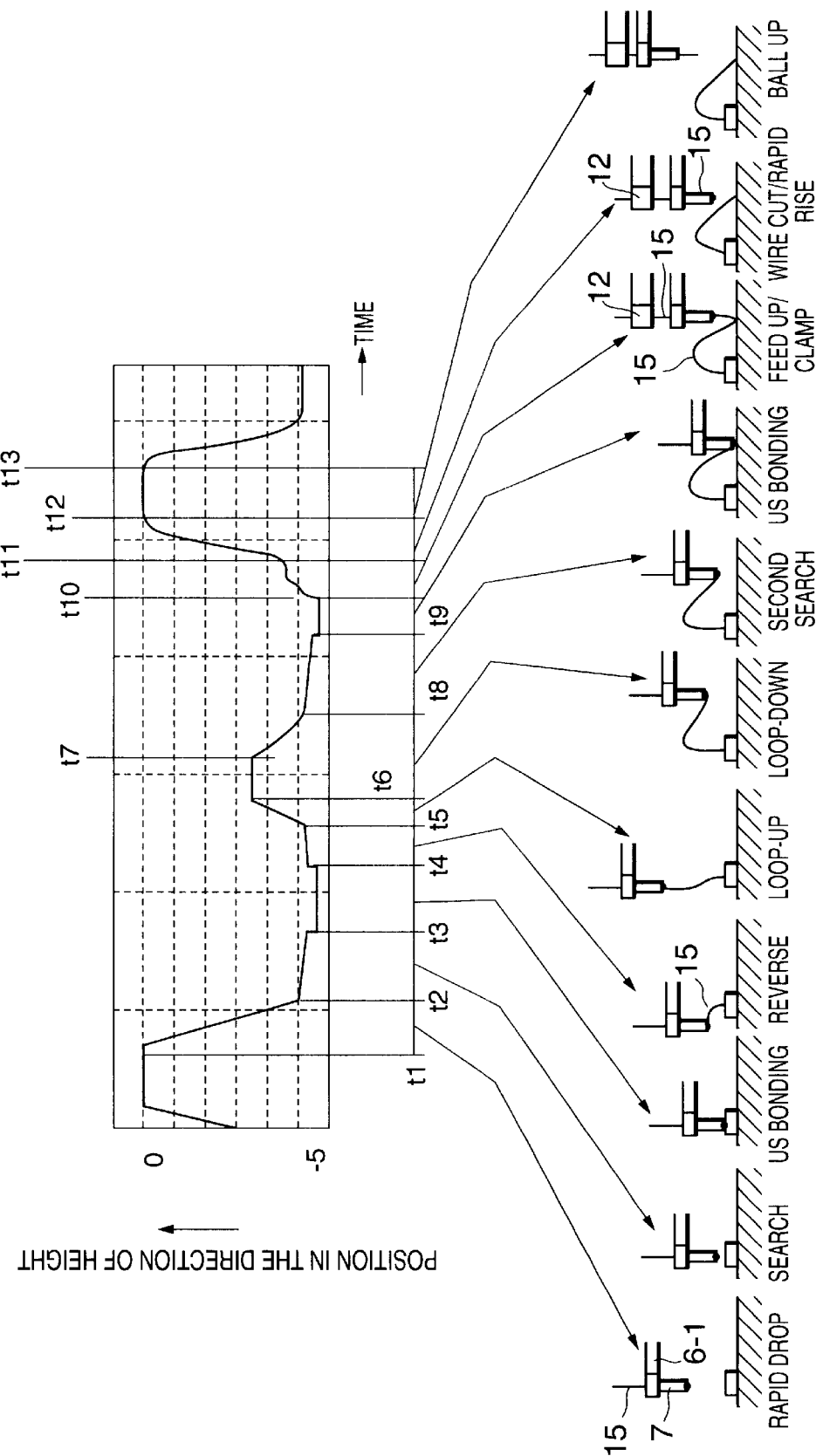
FIG. 4 is a diagram showing the processing performed by the wire bonding apparatus when actually performing wire bonding.
Figure 5:
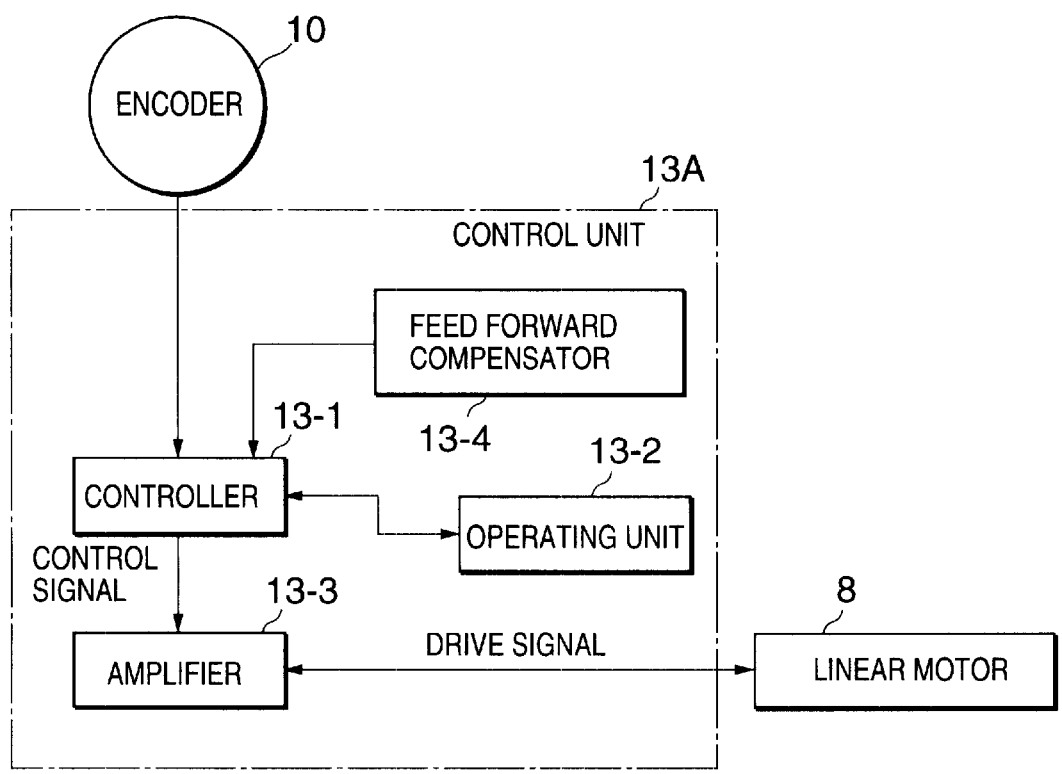
FIG. 5 is a block diagram showing the essential portion of an electronic circuit in a control unit that is attached to a wire bonding apparatus according to a first embodiment of the present invention.

FIG. 5 is a block diagram showing the essential portion of an electronic circuit in a control unit that is attached to a wire bonding apparatus according to a first embodiment of the present invention. The same reference numerals used in FIG. 3 are also used to denote corresponding or identical components in FIG. 5. A control unit 13A, rather than the control unit 13, is attached to the wire bonding apparatus structured as shown in FIGS. 1 and 2.

The control unit 13A includes a.controller 13-1, an operating unit 13-2, an amplifier 13-3 and a feed forward compensator 13-4. The feed forward compensator 13-4 employs the distance between the center Si of a rotary shaft 5 and the center of gravity W1 of the bonding arm 6, the mass of the bonding arm 6, and the acceleration that is generated when an XY stage 1 is moved along the XY axes to calculate the reaction force F1, which will be applied to a bonding head 9 by the acceleration generated when the bonding head 9 is moved along the XY axes. The feed forward compensator 13-4 then transmits the calculated reaction force F1 as a feed forward value to the controller 13-1.

The current position of the bonding head 9 along the Z axis is transmitted by an encoder 10 to the controller 13-1. The operating unit 13-2 calculates the next position to which the bonding head 9 will be moved along the Z axis, and transmits the position to the controller 13-1. The controller 13-1 generates a control signal (torque instruction value) by using the current position of the bonding head 9 along the Z axis, which is received from the encoder 10, and the next movement position, which is received from the operating unit 13-2. The controller 13-1 then corrects the control signal, in accordance with the feed forward value received from the feed forward compensator 13-4, and transmits the resultant control signal to the amplifier 13-3. The amplifier 13-3 amplifies the control signal received from the controller 13-1, and transmits the obtained control signal as a drive signal to the linear motor 8. Upon the reception, via the amplifier 13-3, of the control signal from the controller 13-1, the linear motor 8 is actuated and applies the thrusting force to the rear of the bonding arm 6. In response to the thrusting force, the bonding arm 6 pivots at the rotary shaft 5, and the bonding head 9 is moved vertically.

Figure 7:
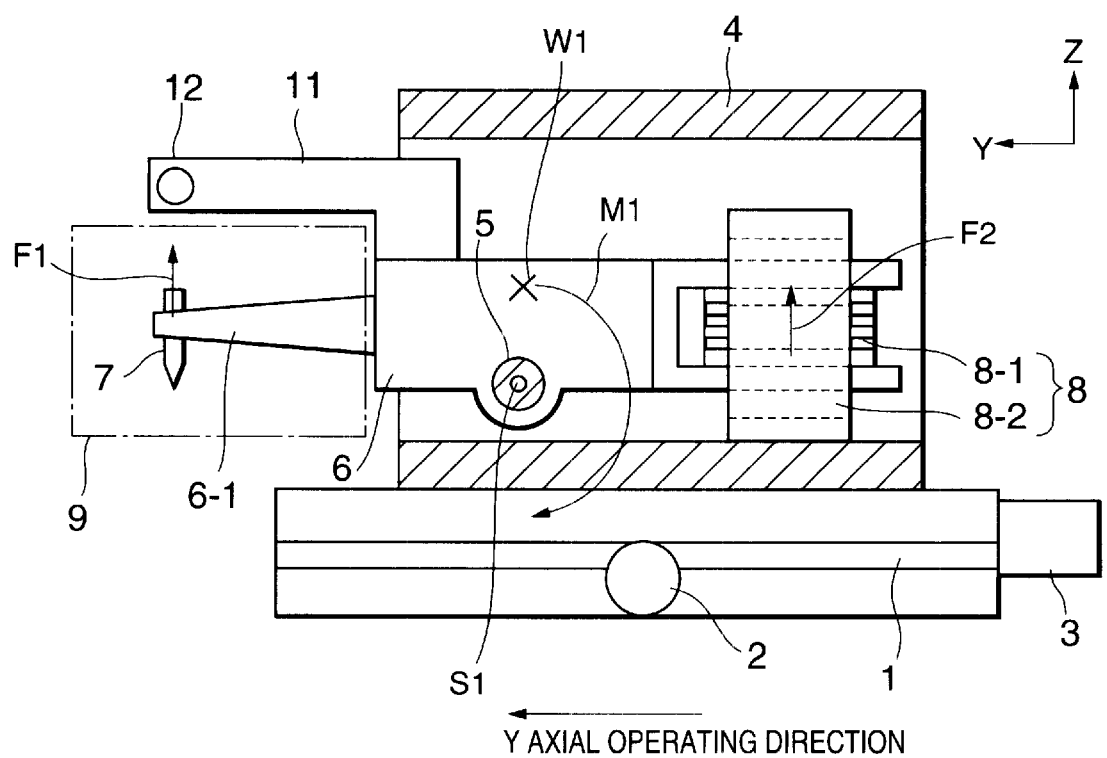
FIG. 7 is a diagram showing the state wherein a thrusting force F2 is applied to the rear of the bonding arm.

At this time, as is shown in FIG. 7, the thrusting force F2 acts on the rear of the bonding arm 6 and counters the reaction force F1. That is, the thrusting force F2 acts as the inverted phase of the reaction force F1 so that the two forces offset each other. Thus, the reaction force F1,which is applied to the bonding head 9 due to the acceleration generated when the bonding arm 6 is moved along the XY axes, is countered and there is less interference with the positioning of the bonding head 9 along the Z axis, thereby making it possible for accurate wire loop control to be exercised.

Figure 6:
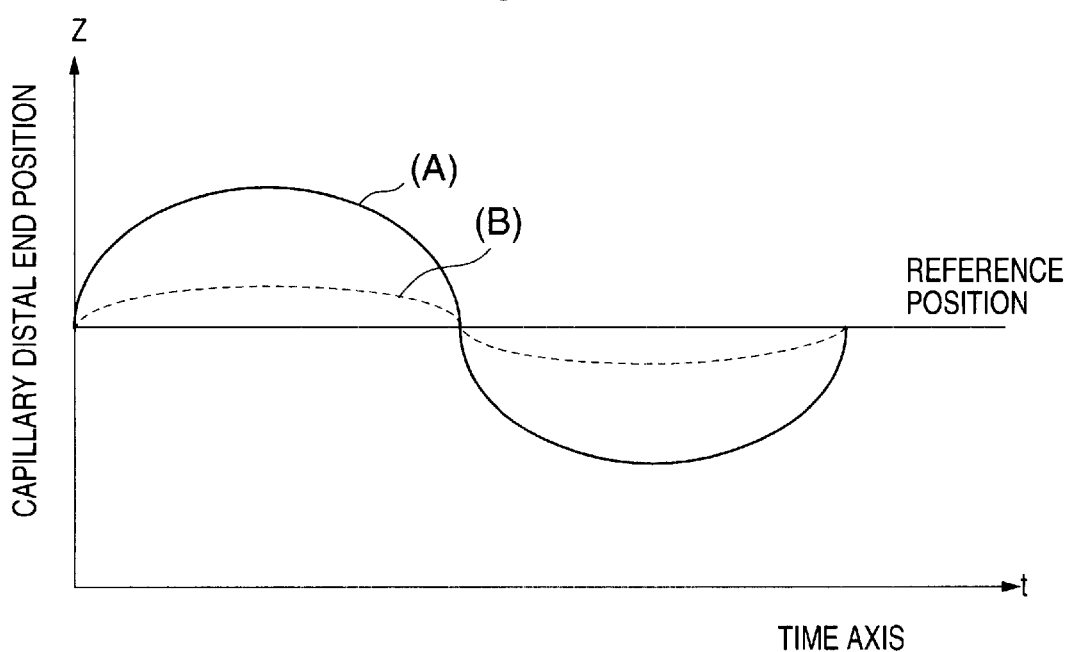
FIG. 6 is a graph showing a comparison between the characteristic of this embodiment and a conventional characteristic relative to the distance from a reference position to which the distal end of a capillary is shifted when a bonding arm, together with an XY stage, is moved rapidly while positioning control is exercised to halt the bonding head at the reference position.

FIG. 6 is a graph showing the comparison between the characteristic (B) of this embodiment and a conventional characteristic (A) relative to the distance the distal end of the capillary 7 is shifted away from a reference position when the bonding arm 6, together with the XY stage 1, is being moved rapidly while positioning control is being exerted to halt the bonding head 9 at the reference position. In FIG. 6, line A describes the conventional characteristic, and line B describes the characteristic in this embodiment.

When the center of gravity W1 of the bonding arm 6 corresponds to the center Si of the rotary shaft 5, the moment M1 due to the shifting of the center of gravity does not occur and the reaction force F1 is not generated, even when the bonding arm 6, together with the XY stage, is moved rapidly along the Y axis. However, when the center of gravity W1 of the bonding arm 6 does not correspond to the center S1 of the rotary shaft 5, the moment M1 occurs due to the shifting of the center of gravity, and the reaction force F1 is generated when the bonding arm 6, together with the XY stage 1, is moved rapidly along the Y axis. In the positioning control of the bonding head 9 along the Z axis, the reaction force F1 acts as an unexpected turbulence, and as is indicated by the characteristic A in FIG. 6, the positioning of the bonding head 9 along the Z axis is greatly shifted away from the target locus.

The reaction force F1 that occurs due to the shifting of the center of gravity can be calculated based on the distance between the center S1 of the rotary shaft 5 and the center of gravity W1 of the bonding arm 6, the mass of the bonding arm 6 and the acceleration generated when the XY stage 1 is moved rapidly along the Y axis. In this embodiment, the reaction force F1 that would be imposed due to the shifting of the center of gravity is calculated in advance, and a drive signal is transmitted to the linear motor 9 so as to exert the thrusting force F2 in the opposite direction as a feed forward correction, thereby offsetting the reaction force F1. As a result, as is indicated by the characteristic B in FIG. 2, the distance the distal end of the capillary 7 is shifted away from the reference position can be reduced.

In the first embodiment, even when the position of the center of gravity W1 is changed by the alteration of the bonding head 9, this can be coped with merely by adjusting the value of a parameter that is used by the feed forward compensator 13-4 to calculate the reaction force F1. Therefore, the hardware alteration of a control system is not required, and alteration costs can be reduced.

Second Embodiment

Figure 8:
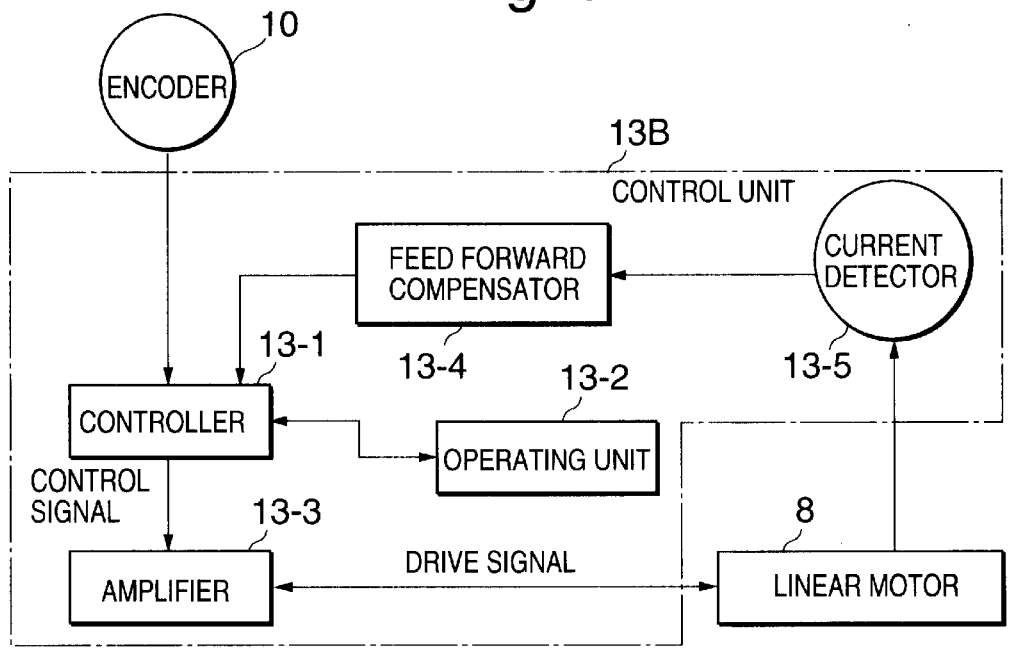
FIG. 8 is a block diagram showing the essential portion of an electronic circuit in a control unit that is attached to a wire bonding device according to a second embodiment of the present invention.

In a second embodiment, as is shown in FIG. 8, a current detector 13-5 is provided inside a control unit 13B. The current detector 13-5 detects a currant flowing across a linear motor 8 and transmits the detected current to a feed forward compensator 13-6. The feed forward compensator 13-6 calculates the reaction force F1 applied to a bonding head 9 by using the value of the current flowing across the linear motor 8 that is detected by the current detector 13-5.

When the reaction force F1 acts on the bonding head 9, inverted excitation power is applied to the linear motor 8, and the value of the current flowing through the motor 8 is changed. In this embodiment, this change in the current value is employed, and the reaction force F1 is calculated by the feed forward compensator 13-6. Specifically, in FIG. 8, the feed forward compensator 13-6 receives the value of the current flowing through the linear motor 8 that is detected by the current detector 13-5, and subtracts from the obtained current value the value of the current that is required for positioning control along the Z axis. Thus, the value of a current occurring due to the reaction force F1 is detected, and then the reaction force F1 is calculated based on the detected current value and is transmitted as a feed forward value to a controller 13-1.

In the second embodiment, even when the location of the exact center of gravity is not obtained, the reaction force F1 can be calculated by employing an inverted calculation that uses the value of the current flowing through the linear motor 8. Therefore, even when the location of the center of gravity of the bonding arm 6 is changed due to the alteration of the bonding head 9, a hardware change involving the control system is not required, and unlike the first embodiment, the value of the parameter need not also be adjusted.

Third Embodiment

Figure 9:
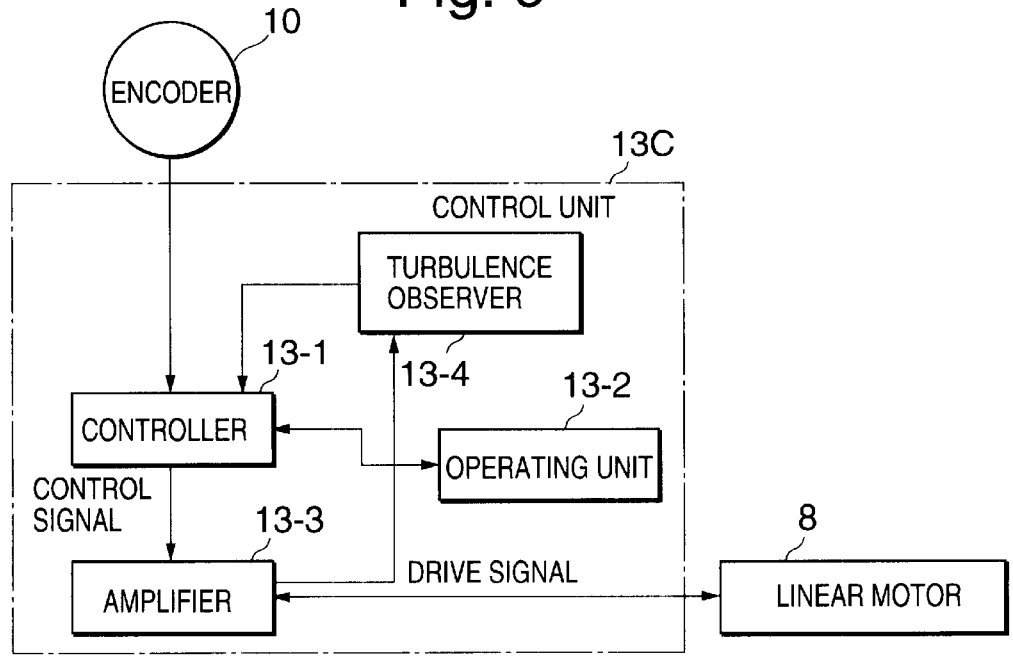
FIG. 9 is a block diagram showing the essential portion of an electronic circuit in a control unit that is attached to a wire bonding device according to a third embodiment of the present invention.

In a third embodiment, as is shown in FIG. 9, a turbulence observer 13-7 is provided, for a control unit 13C, that calculates the reaction force F1 that is applied to a bonding head 9. While referring to the physical model of a control system, the turbulence observer 13-7 estimates the reaction force F1,which is an unknown state variable, based on a torque instruction value, which is transmitted to the linear motor 8, and the current location (the location along the Z axis) of the bonding head 9, which is detected by an encoder 10, and transmits the estimated reaction force F1 to a controller 13-1.

In the third embodiment, the reaction force F1 can be calculated even when the exact location of the center of gravity is not determined, and the same effects can be acquired as are obtained in the second embodiment. Further, an unknown turbulence element or the fluctuation of a parameter that occurs in real time can be detected, so that more accurate wire loop control can be exercised.

As is apparent from the above description, according to the present invention, the reaction force, which is applied to the bonding head when the bonding head is moved horizontally, is calculated and is used to correct a torque instruction value that is transmitted to means for driving the bonding arm, and the thrusting force for countering the reaction force applied to the bonding head is generated. Therefore, when the bonding head is moved horizontally (along the XY axes), there is less interference with the positioning control of the bonding head in the perpendicular direction (along the Z axis), and accurate wire loop control can be exercised.

Furthermore, according to the present invention, the reaction force applied to the bonding head is calculated based on the distance between the center of the rotary shaft and the center of gravity of the bonding arm, the mass of the bonding arm and the acceleration generated when the stage is moved horizontally. Thus, even when the position of the center of gravity of the bonding arm is changed by altering the bonding arm, only the value of a parameter used for the reaction force calculation need be adjusted. As a result, an alteration of the hardware of the control system is not required, and the alteration costs can be reduced.

Further, according to the present invention, the motor (e.g., a linear motor) is employed as means for driving the bonding arm, and the reaction force applied to the bonding arm is calculated based on the value of a current that flows through the motor. Thus, even when the exact location of the center of gravity is not obtained, the reaction force can be calculated by employing an inverse calculation using the value of the current that flows through the motor. Therefore, when the location of the center of gravity of the bonding arm 6 is changed due to the alteration of the bonding head, alteration of the hardware of the control system-is not required, and also, the value of the parameter need not be adjusted.

In addition, according to the present invention, the reaction force applied to the bonding head is calculated based on the torque instruction value, which is transmitted to the means for driving the bonding arm, and the current position (the position along the Z axis) of the bonding head. Therefore, an unknown turbulence element and the fluctuation of a parameter that occurs in real time can be detected, so that more accurate wire loop control can be exercised.

What is claimed is:

1. A wire bonding apparatus comprising:

stage driving means for driving a stage horizontally;

a bonding arm provided on said stage so as to rotate at a rotary shaft, that is perpendicular to the direction in which said stage is moved;

a capillary provided at the distal end portion of said bonding arm to constitute a bonding head;

bonding arm driving means for rotating said bonding arm at said rotary shaft and for moving said bonding head vertically;

reaction force calculation means for calculating a reaction force applied to said bonding head when said stage is moved horizontally; and means for employing said reaction force, obtained by said reaction force calculation means, for correcting a torque instruction value that is to be transmitted to said bonding arm driving means and for generating a thrusting force for countering said reaction force applied to said bonding head.

2. A wire bonding apparatus according to claim 1, wherein said reaction force calculation means calculates said reaction force applied to said bonding head based on the distance between the center of said rotary shaft and the center of gravity of said bonding arm, the mass of said bonding arm, and the acceleration generated when said stage is moved horizontally.

3. A wire bonding apparatus according to claim 1, wherein said bonding arm driving means is a motor, and wherein said reaction force calculation means calculates a reaction force applied to said bonding head based on the value of a current flowing through said motor.

4. A wire bonding apparatus according to claim 1, wherein said reaction force calculation means calculates a reaction force applied to said bonding head based on a torque instruction value, which is transmitted to said bonding arm driving means, and the current vertical position of said bonding head.

* * * * *